United States Patent
Kao et al.

(10) Patent No.: US 10,582,643 B2
(45) Date of Patent: Mar. 3, 2020

(54) RADIATING FIN AND CONNECTION STRUCTURE THEREOF

(71) Applicant: ASIA VITAL COMPONENTS CO., LTD., New Taipei (TW)

(72) Inventors: Pai-Ling Kao, New Taipei (TW); Xue-Hui Liu, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 0 days.

(21) Appl. No.: 15/951,140

(22) Filed: Apr. 11, 2018

(65) Prior Publication Data

US 2019/0320551 A1  Oct. 17, 2019

(51) Int. Cl.
| F28F 7/00 | (2006.01) |
| H05K 7/20 | (2006.01) |
| F28F 3/08 | (2006.01) |

(52) U.S. Cl.
CPC .......... H05K 7/2039 (2013.01); F28F 3/083 (2013.01); *F28F 2215/04* (2013.01)

(58) Field of Classification Search
CPC ..... F28F 3/083; F28F 2215/04; H05K 7/2039
USPC ....................................... 165/80.3
See application file for complete search history.

(56) References Cited

U.S. PATENT DOCUMENTS

| 1,896,501 | A | * | 2/1933 | Whitaker | ........... | B22D 19/0063 |
| | | | | | | 164/105 |
| 8,109,323 | B2 | * | 2/2012 | Lian | ................... | H01L 23/3672 |
| | | | | | | 165/104.33 |
| 9,603,292 | B2 | * | 3/2017 | Kurz | .................... | H05K 7/2039 |
| 2005/0269059 | A1 | * | 12/2005 | Chen | ......................... | F28F 3/02 |
| | | | | | | 165/80.3 |
| 2006/0225866 | A1 | * | 10/2006 | Chen | ........................ | F28F 3/02 |
| | | | | | | 165/80.3 |
| 2007/0215320 | A1 | * | 9/2007 | Deng | .................. | H01L 23/3672 |
| | | | | | | 165/80.3 |
| 2009/0165999 | A1 | * | 7/2009 | Liu | ..................... | H01L 23/3672 |
| | | | | | | 165/80.3 |
| 2009/0255649 | A1 | * | 10/2009 | Feng | .................. | H01L 23/3672 |
| | | | | | | 165/80.3 |
| 2009/0288810 | A1 | * | 11/2009 | Feng | ........................ | F28F 3/02 |
| | | | | | | 165/149 |
| 2009/0316362 | A1 | * | 12/2009 | Li | ....................... | H01L 23/3672 |
| | | | | | | 361/703 |
| 2010/0132919 | A1 | * | 6/2010 | Han | .................... | H01L 23/3672 |
| | | | | | | 165/80.3 |

(Continued)

*Primary Examiner* — Claire E Rojohn, III
(74) *Attorney, Agent, or Firm* — Jackson IPG PLLC; Demian K. Jackson

(57) ABSTRACT

A radiating fin and a connection structure composed of multiple radiating fins. Each radiating fin has a main body formed with a first plane face. A first bending edge and a second bending edge extend from two sides of the first plane face. The first plane face is formed with a first perforation and a second perforation and a third perforation and a fourth perforation. A first extension section and a second extension section respectively from the first and second bending edges. Two front ends of the first extension section are bent and formed with a first latch plate and a second latch plate. Two front ends of the second extension section are bent and formed with a third latch plate and a fourth latch plate. The latch plates of a forward radiating fin are correspondingly passed through and latched in the perforations of an adjacent rearward radiating fin.

10 Claims, 9 Drawing Sheets

(56) References Cited

U.S. PATENT DOCUMENTS

| | | | | |
|---|---|---|---|---|
| 2010/0236755 A1* | 9/2010 | Li | ................... | H01L 23/3672 |
| | | | | 165/80.3 |
| 2010/0252240 A1* | 10/2010 | Li | ................... | H01L 23/3672 |
| | | | | 165/104.26 |
| 2010/0294462 A1* | 11/2010 | Lin | ................... | H01L 23/3672 |
| | | | | 165/80.3 |
| 2011/0048675 A1* | 3/2011 | Xu | ................... | H01L 23/3672 |
| | | | | 165/80.3 |

* cited by examiner

RADIATING FIN AND CONNECTION STRUCTURE THEREOF

BACKGROUND OF THE INVENTION

1. Field of the Invention

The present invention relates generally to a radiating fin and a connection structure thereof, and more particularly to a radiating fin and a connection structure of the radiating fin, which has a concealing effect and more securely connection effect.

2. Description of the Related Art

Due to the advance of sciences and technologies, the operation performance of electronic components has become higher and higher. Accordingly, the requirement for the function of the heat sink is increased. In a conventional heat sink, in order to enhance the heat dissipation effect, the radiating fin assembly composed of stacked radiating fins is widely used. Also, it has become a critical issue how to develop improved radiating fins to achieve high-performance heat sink.

Please refer to FIG. 1, which is a perspective view of a conventional radiating fin. As shown in FIG. 1, the radiating fin assembly 1 is composed of multiple radiating fins 11 stacked on each other. Two lateral sides of the radiating fin 11 are respectively formed with a bending edge 111. A latch end 1112 and a latch section 1111 are disposed on the bending edge 111. When a radiating fin 11 and another radiating fin 11 are stacked and assembled with each other, the bending edges 111 of the forward radiating fin 11 abut against the plane face 112 of the rearward radiating fin 11. The latch ends 1112 of the forward radiating fin 11 are latched with the latch sections 1111 of the rearward radiating fin 11, whereby the two radiating fins 11 are connected with each other.

After the conventional radiating fins are completely assembled, the latching structures, (that is, the latch sections 1111 and the latch ends 1112) of the conventional radiating fins are exposed to outer side of the radiating fins. Therefore, as a whole, the appearance of the radiating fin assembly 1 is relatively poor. In addition, the latch ends 1112 and the latch sections 1111 are disposed on the bending edges 111 so that after the radiating fins 11 are assembled with each other, the latch ends 1112 and the latch sections 1111 will be more or less deformed under external force affection. Under such circumstance, the security of the radiating fin assembly is relatively poor and the radiating fins are apt to loosen or detach from each other.

According to the above, the conventional radiating fin has the following shortcomings:
1. As a whole, the appearance of the radiating fin assembly is relatively poor.
2. The security of the connection structures between the respective radiating fins is relatively poor and the radiating fins are apt to loosen or detach from each other.

It is therefore tried by the applicant to provide a radiating fin and a connection structure of the radiating fin to solve the above problems existing in the conventional radiating fin.

SUMMARY OF THE INVENTION

It is therefore a primary object of the present invention to provide a radiating fin having concealing effect.

It is a further object of the present invention to provide a radiating fin, which can enhance the security of the connection structures between the radiating fins.

It is still a further object of the present invention to provide a radiating fin connection structure having concealing effect.

It is still a further object of the present invention to provide a radiating fin connection structure which can enhance the security of the connection structures between the radiating fins.

To achieve the above and other objects, the radiating fin of the present invention includes a main body. The main body has a first plane face. A first bending edge and a second bending edge extend from two sides of the first plane face. The first plane face is formed with a first perforation and a second perforation along the first bending edge. The first plane face is formed with a third perforation and a fourth perforation along the second bending edge. A first extension section and a second extension section respectively perpendicularly extend from the first and second bending edges. Two front ends of the first extension section are respectively bent and formed with a first latch plate and a second latch plate. Two front ends of the second extension section are respectively bent and formed with a third latch plate and a fourth latch plate. The first, second, third and fourth latch plates respectively correspond to the first, second, third and fourth perforations.

To achieve the above and other objects, the radiating fin connection structure of the present invention includes multiple radiating fins. Each radiating fin includes a main body. The main body has a first plane face. A first bending edge and a second bending edge extend from two sides of the first plane face. The first plane face is formed with a first perforation and a second perforation along the first bending edge. The first plane face is formed with a third perforation and a fourth perforation along the second bending edge. A first extension section and a second extension section respectively perpendicularly extend from the first and second bending edges. Two front ends of the first extension section are respectively bent and formed with a first latch plate and a second latch plate. Two front ends of the second extension section are respectively bent and formed with a third latch plate and a fourth latch plate. The first, second, third and fourth latch plates respectively correspond to the first, second, third and fourth perforations. The radiating fins are stacked and assembled with each other, the first, second, third and fourth latch plates of a forward radiating fin being correspondingly passed through and latched in the first, second, third and fourth perforations of an adjacent rearward radiating fin. According to the structural design of the present invention, the first, second, third and fourth latch plates of the forward radiating fin are correspondingly passed through the first, second, third and fourth perforations of the rearward radiating fin and securely latched therewith. In this case, the first, second, third and fourth latch plates are totally concealed in the radiating fin so that in the whole appearance, the latching structure and manner between the radiating fins of the radiating fin module will not be seen. Therefore, the connection structure of the radiating fin has a concealing effect and the respective radiating fins can be more securely connected with each other.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
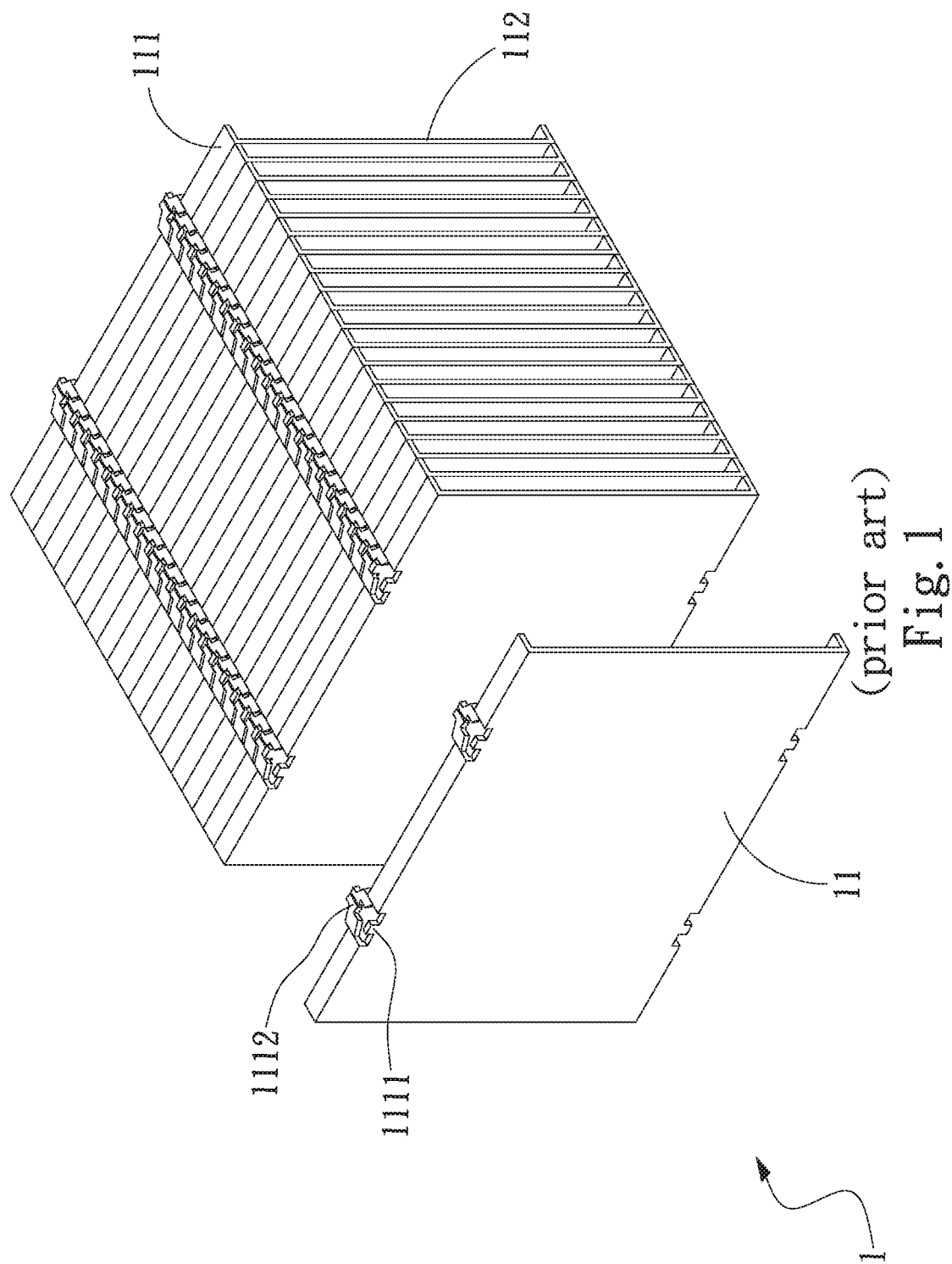
FIG. 1 is a perspective view of a conventional radiating fin.
Figure 2:
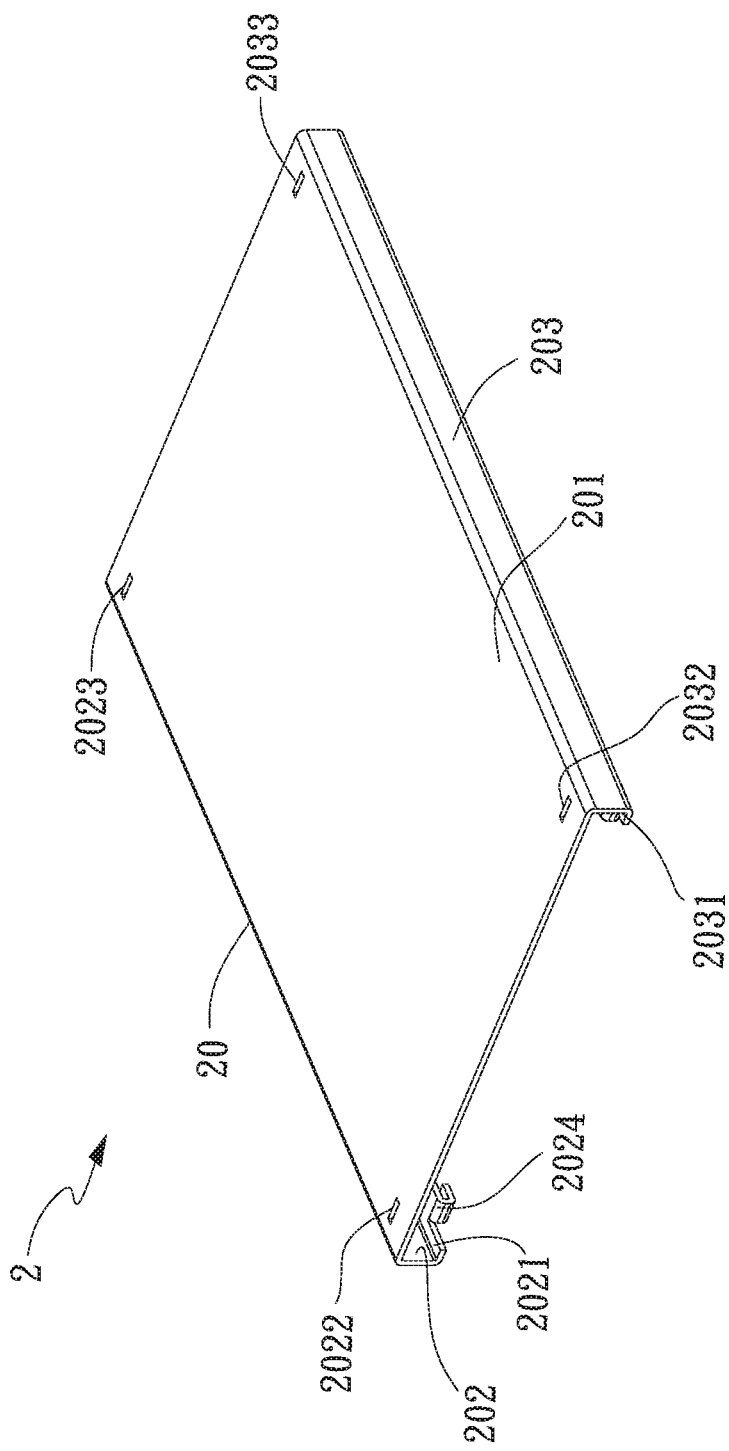
FIG. 2 is a perspective view of a first embodiment of the radiating fin of the present invention.
Figure 3A:
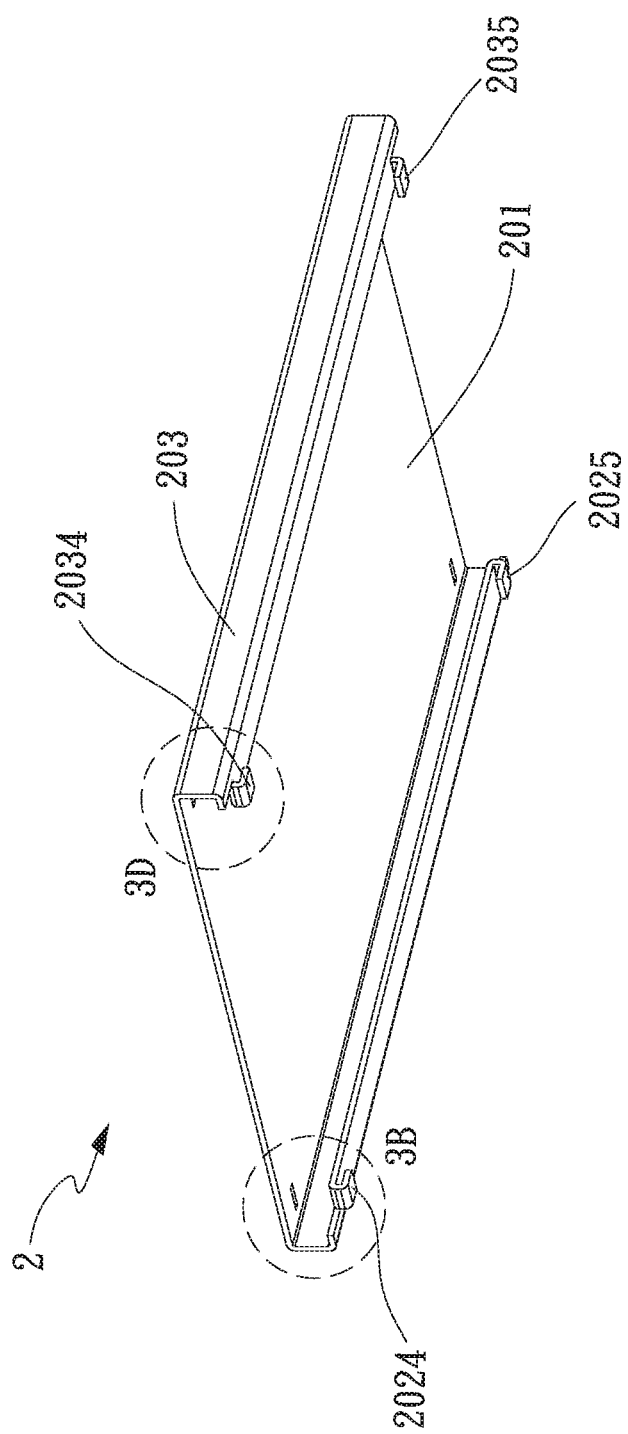
FIG. 3A is another perspective view of the first embodiment of the radiating fin of the present invention.
Figure 3B:
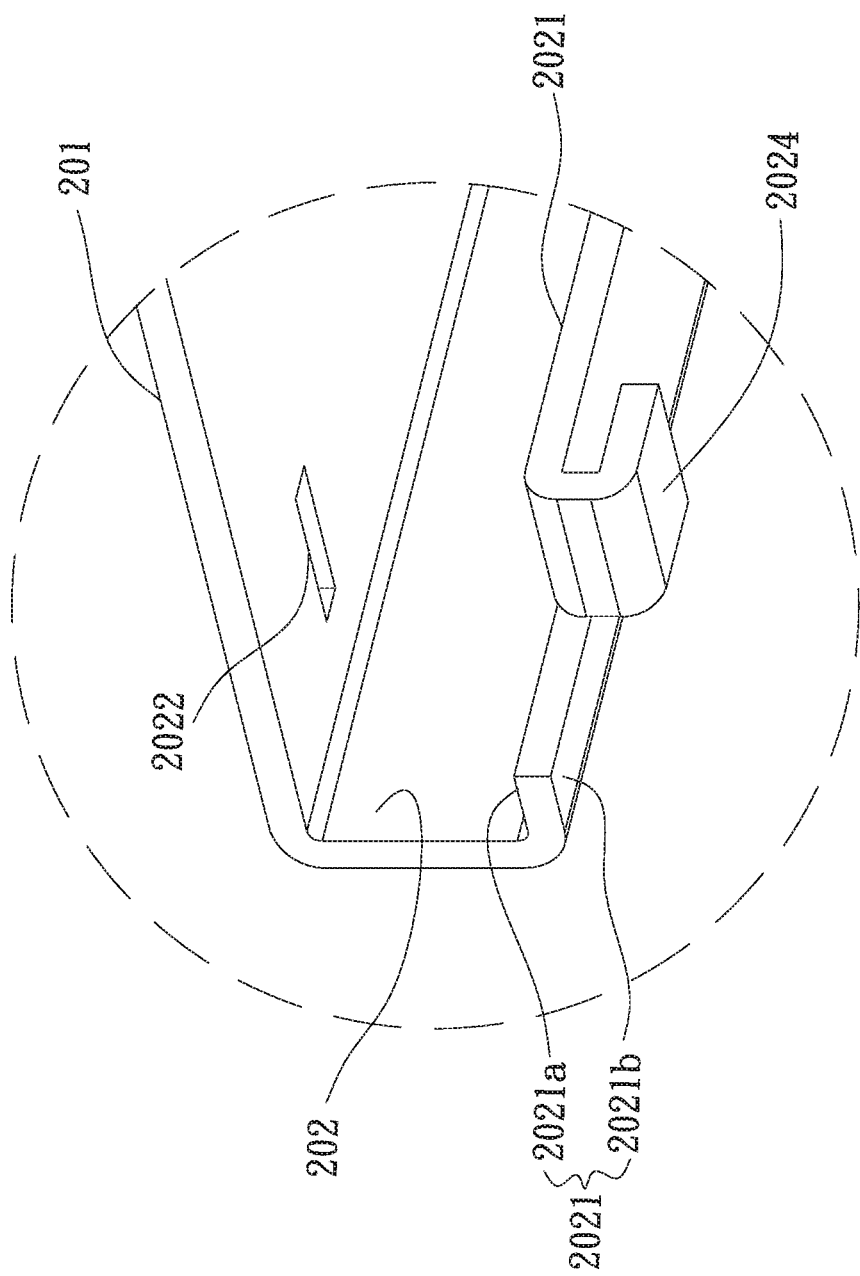
FIG. 3B is an enlarged view of circled area of FIG. 3A.
Figure 3C:
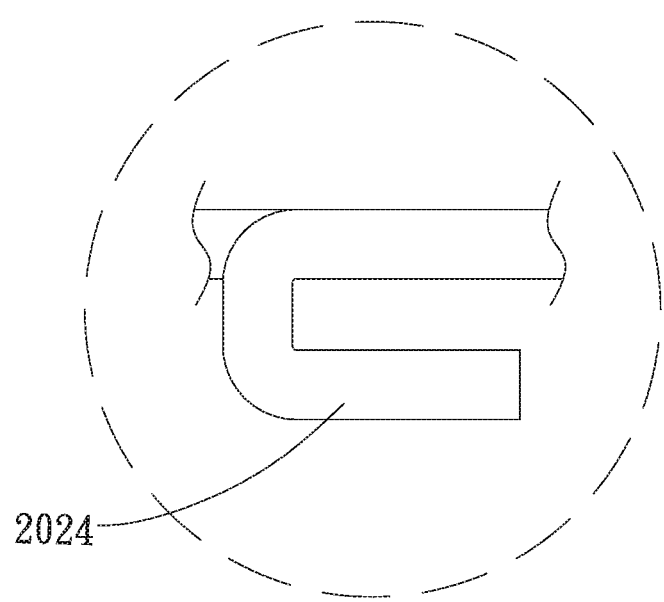
FIG. 3C is a side enlarged view of the first embodiment of the radiating fin of the present invention.
Figure 3D:
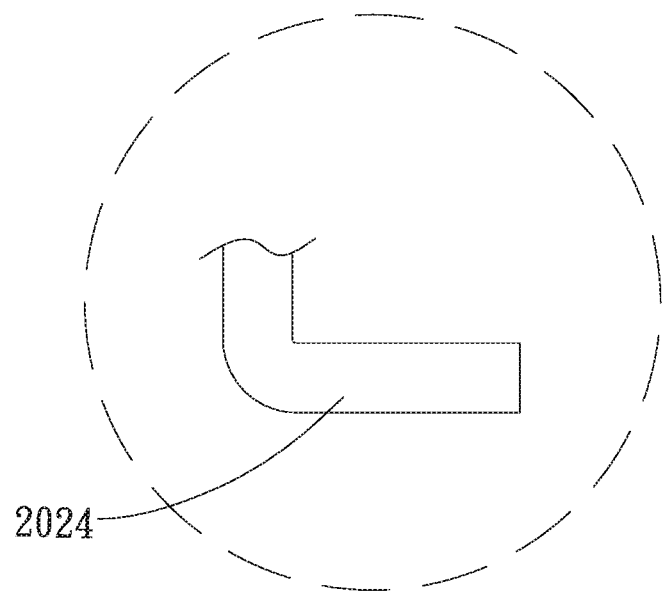
FIG. 3D is another side enlarged view of the first embodiment of the radiating fin of the present invention.
Figure 3E:
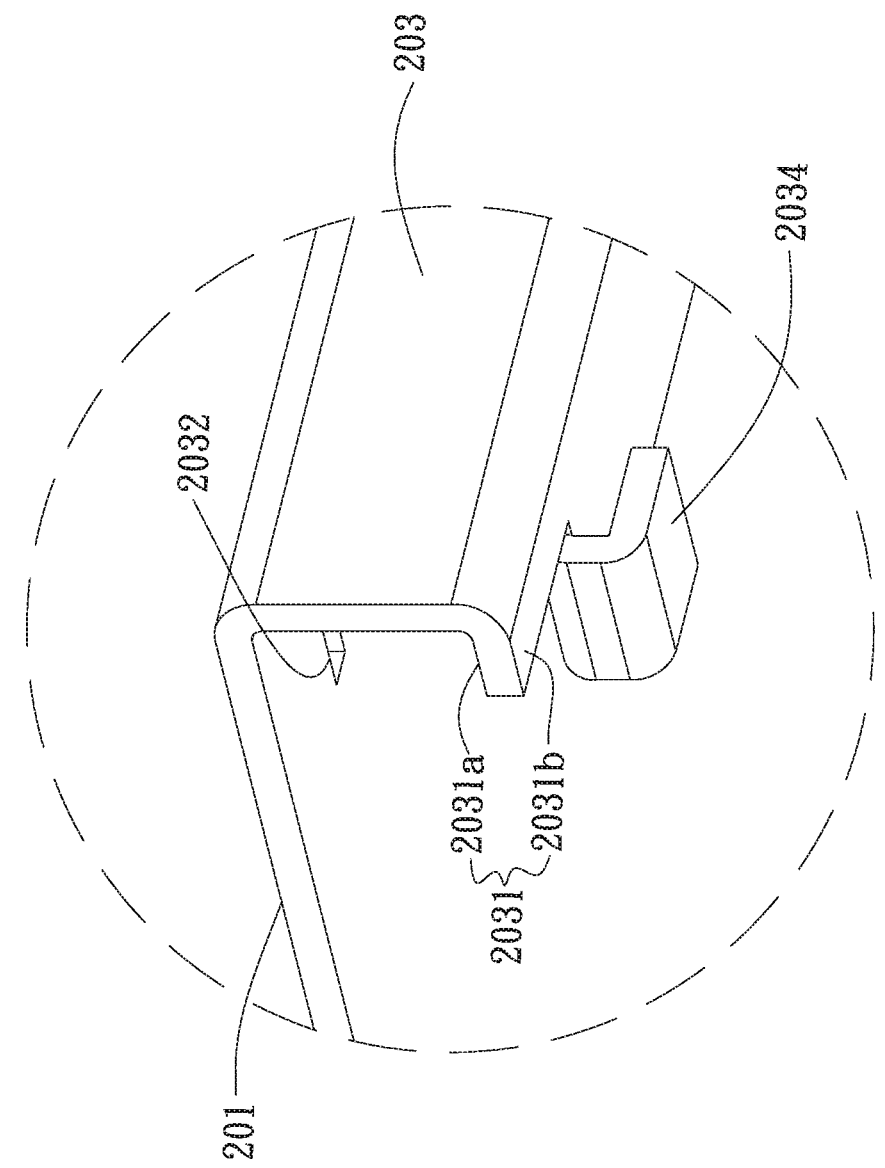
FIG. 3E is another enlarged view of circled area of FIG. 3A.

Please refer to FIGS. 2, 3A, 3B, 3C, 3D and 3E. FIG. 2 is a perspective view of a first embodiment of the radiating fin of the present invention. FIG. 3A is another perspective view of the first embodiment of the radiating fin of the present invention. FIG. 3B is an enlarged view of circled area of FIG. 3A. FIG. 3C is a side enlarged view of the first embodiment of the radiating fin of the present invention. FIG. 3D is another side enlarged view of the first embodiment of the radiating fin of the present invention. FIG. 3E is another enlarged view of circled area of FIG. 3A. According to the first embodiment, the radiating fin 2 of the present invention includes a main body 20 having a first plane face 201. A first bending edge 202 and a second bending edge 203 extend from two sides of the first plane face 201. The first plane face 201 is formed with a first perforation 2022 and a second perforation 2023 along the first bending edge 202. The first plane face 201 is formed with a third perforation 2032 and a fourth perforation 2033 along the second bending edge 203. The first, second, third and fourth perforations 2022, 2023, 2032, 2033 are formed through the main body 20.

A first extension section 2021 and a second extension section 2031 respectively perpendicularly extend from the first and second bending edges 202, 203. The first extension section 2021 has a first side 2021a and a second side 2021b. Two front ends of the first extension section 2021 are respectively formed with a first latch plate 2024 and a second latch plate 2025 bent from the first side 2021a to the second side 2021b. The first and second latch plates 2024, 2025 are parallel to the first extension section 2021. The second extension section 2031 has a third side 2031a and a fourth side 2031b. Two front ends of the second extension section 2031 are respectively formed with a third latch plate 2034 and a fourth latch plate 2035 bent from the third side 2031a to the fourth side 2031b. The third and fourth latch plates 2034, 2035 are parallel to the second extension section 2031. The first, second, third and fourth latch plates 2024, 2025, 2034, 2035 respectively correspond to the first, second, third and fourth perforations 2022, 2023, 2032, 2033.

In the present invention, the size of the first, second, third and fourth latch plates 2024, 2025, 2034, 2035 are designed in accordance with the size of the first, second, third and fourth perforations 2022, 2023, 2032, 2033. The configurations of the respective latch plates and the perforations are not limited. In this embodiment, the cross section of the respective latch plates is, but not limited to, U-shaped or C-shaped or reverse U-shaped or L-shaped for illustration purposes (as shown in FIGS. 3C and 3D), while the respective perforations have, but not limited to, a rectangular shape for illustration purposes. In practice, the latch plates can be otherwise shaped for passing through the perforations to achieve a latching effect. In other words, the first, second, third and fourth latch plates 2024, 2025, 2034, 2035 of the present invention can have any configuration and size as long as the first, second, third and fourth latch plates 2024, 2025, 2034, 2035 can be latched in the first, second, third and fourth perforations 2022, 2023, 2032, 2033.

Figure 4A:
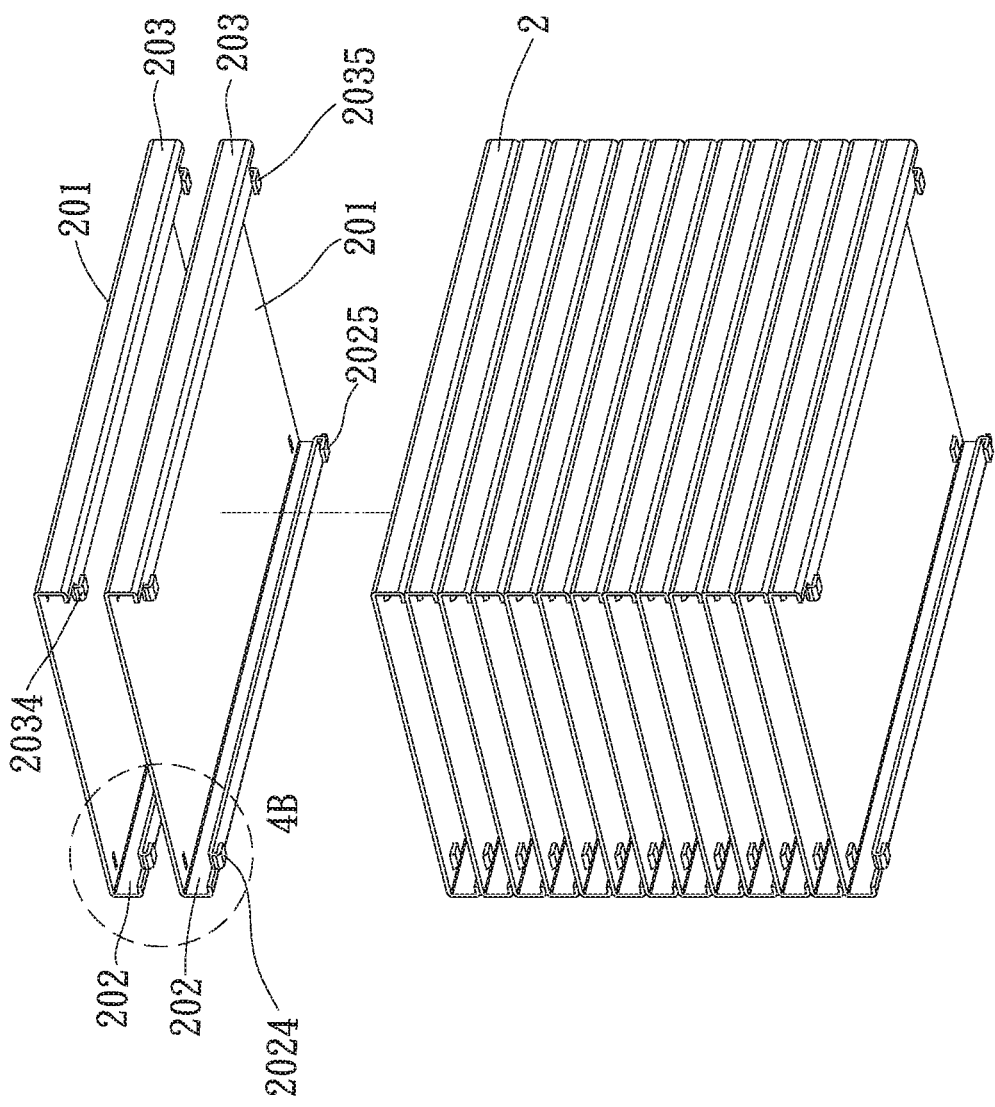
FIG. 4A is a perspective exploded view of a first embodiment of the connection structure of the radiating fin of the present invention.
Figure 4B:
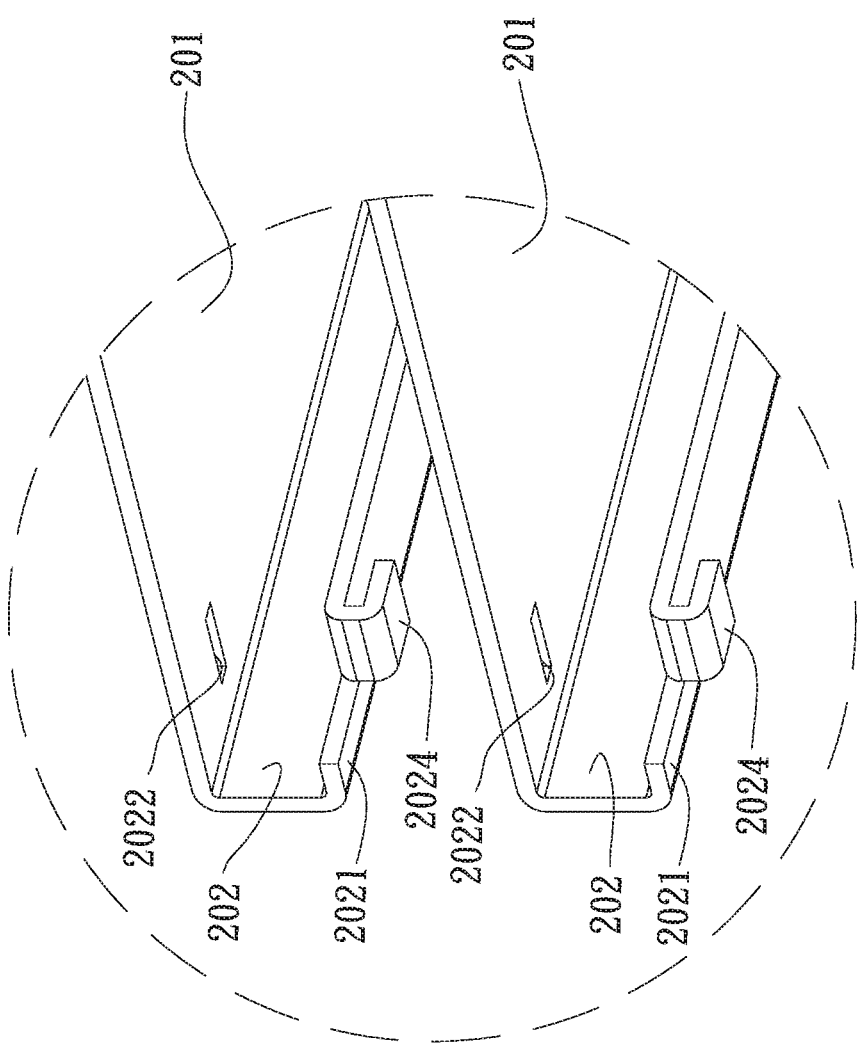
FIG. 4B is an enlarged view of circled area of FIG. 4A.
Figure 5:
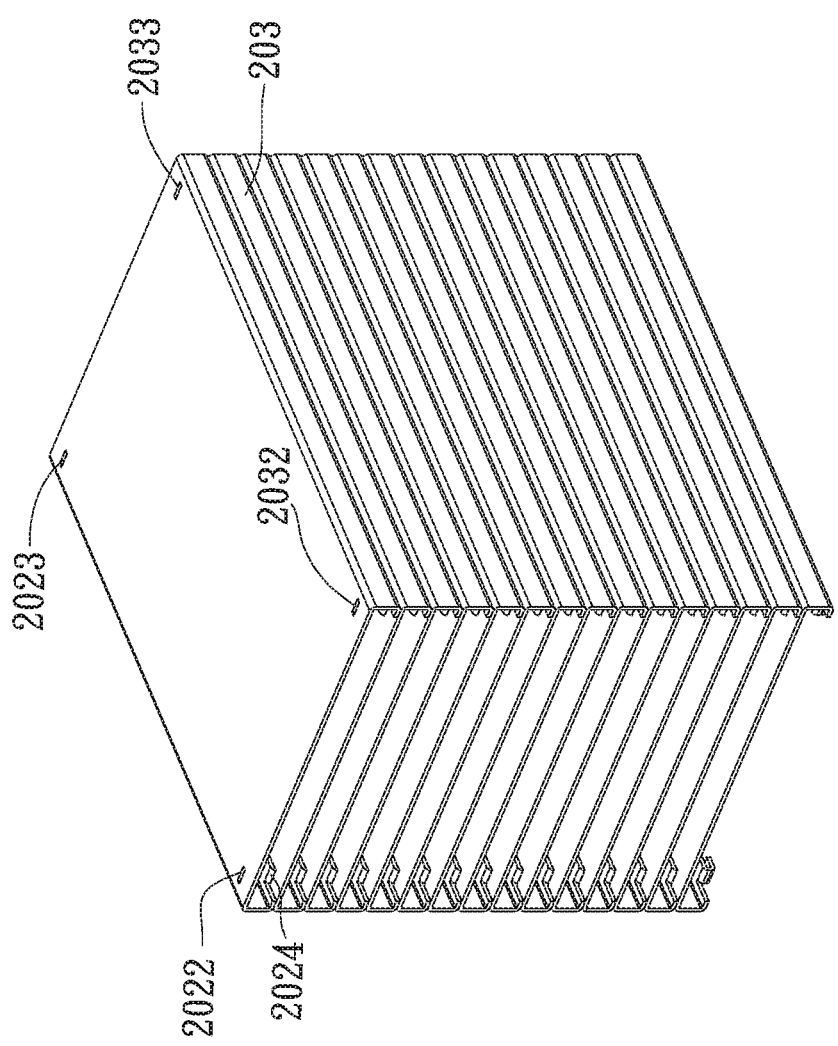
FIG. 5 is a perspective assembled view of the first embodiment of the connection structure of the radiating fin of the present invention.

Please now refer to FIGS. 4A, 4B and 5. FIG. 4A is a perspective exploded view of a first embodiment of the connection structure of the radiating fin of the present invention. FIG. 4B is an enlarged view of circled area of FIG. 4A. FIG. 5 is a perspective assembled view of the first embodiment of the connection structure of the radiating fin of the present invention. The components of the radiating fin 2 and the relationship between the components have been partially described hereinbefore. In this embodiment, the connection structure of the radiating fin is further described. The connection structure of the radiating fin of the present invention includes multiple aforesaid radiating fins 2. Each radiating fin 2 has a first plane face 201 and the aforesaid structural characteristics, (which have been described hereinbefore and thus will not be redundantly described hereinafter). The radiating fins 2 are stacked and assembled with each other. The first, second, third and fourth latch plates 2024, 2025, 2034, 2035 of a forward radiating fin 2 are correspondingly passed through the first, second, third and fourth perforations 2022, 2023, 2032, 2033 of an adjacent rearward radiating fin 2. The first latch plate 2024 is correspondingly latched in the first perforation 2022. The second latch plate 2025 is correspondingly latched in the second perforation 2023. The third latch plate 2034 is correspondingly latched in the third perforation 2032. The fourth latch plate 2035 is correspondingly latched in the fourth perforation 2033, whereby the two radiating fins 2 are stacked and latched with each other.

According to the structural design of the present invention, the first, second, third and fourth latch plates 2024, 2025, 2034, 2035 of the forward radiating fin 2 are correspondingly passed through the first, second, third and fourth perforations 2022, 2023, 2032, 2033 of the rearward radiating fin 2 and securely latched therewith. In this case, the first, second, third and fourth latch plates 2024, 2025, 2034, 2035 are totally concealed in the radiating fin 2 so that in the whole appearance, the latching structure and manner between the radiating fins 2 of the radiating fin module will not be seen. Therefore, the connection structure of the radiating fin 2 has a concealing effect.

Besides, by means of the hook-like structures of the first, second, third and fourth latch plates 2024, 2025, 2034, 2035, the forward radiating fin 2 can be tightly hooked with the rearward radiating fin 2 without loosening. Accordingly, the respective radiating fins 2 can be more securely connected with each other.

In conclusion, in comparison with the conventional radiating fin, the present invention has the following advantages:
1. The connection structure of the radiating fin has concealing effect.
2. The respective radiating fins can be more securely connected with each other.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A radiating fin comprising a main body, the main body having a first plane face and a first bending edge and a second bending edge each extending from two opposed sides of the first plane face, the first plane face being formed with a first perforation and a second perforation each equally spaced away from the first bending edge and with a third perforation and a fourth perforation each equally spaced away from the second bending edge, the first, second, third, and fourth perforations each having a size and shape, a first extension section and a second extension section each respectively perpendicularly extending from the first and second bending edges, two opposed ends of the first extension section being respectively bent and formed with a first latch plate and a second latch plate, each of the first and second latch plates formed a first distance from the first bending edge and each having an end face having a size and shape equal to the size and shape of the first and second perforations, two opposed ends of the second extension section being respectively bent and formed with a third latch plate and a fourth latch plate, each of the third and fourth latch plates formed a second distance from the second bending edge and each having an end face having a size and shape equal to the size and shape of the third and fourth perforations, the first, second, third and fourth latch plates each respectively aligned with the first, second, third and fourth perforations.

2. The radiating fin as claimed in claim 1, wherein the first, second, third and fourth perforations are formed through the main body.

3. The radiating fin as claimed in claim 1, wherein the first extension section has a first side and a second side, the first and second latch plates being bent from the first side to the second side, the first and second latch plates being parallel to the first extension section.

4. The radiating fin as claimed in claim 1, wherein the second extension section has a third side and a fourth side, the third and fourth latch plates being bent from the third side to the fourth side, the third and fourth latch plates being parallel to the second extension section.

5. The radiating fin as claimed in claim 1, wherein the cross section of the first, second, third and fourth latch plates is U-shaped, C-shaped, reverse U-shaped or L-shaped.

6. A radiating fin connection structure comprising multiple radiating fins, each radiating fin including a main body, the main body having a first plane face and a first bending edge and a second bending edge each extending from two opposed sides of the first plane face, the first plane face being formed with a first perforation and a second perforation each equally spaced away from the first bending edge and with a third perforation and a fourth perforation each equally spaced away from the second bending edge, the first, second, third, and fourth perforations each having a size and shape, a first extension section and a second extension section each respectively perpendicularly extending from the first and second bending edges, two opposed ends of the first extension section being respectively bent and formed with a first latch plate and a second latch plate, each of the first and second latch plates formed a first distance from the first bending edge and each having an end face having a size and shape equal to the size and shape of the first and second perforations, two opposed ends of the second extension section being respectively bent and formed with a third latch plate and a fourth latch plate, each of the third and fourth latch plates formed a second distance from the second bending edge and each having an end face having a size and shape equal to the size and shape of the third and fourth perforations, the first, second, third and fourth latch plates each respectively aligned with the first, second, third and fourth perforations, the multiple radiating fins being stacked and assembled with each other such that the first, second, third and fourth latch plates of a forward radiating fin are correspondingly passed through and latched in the first, second, third and fourth perforations of an adjacent rearward radiating fin.

7. The radiating fin connection structure as claimed in claim 6, wherein the first, second, third and fourth perforations are formed through the main body.

8. The radiating fin connection structure as claimed in claim 6, wherein the first extension section has a first side and a second side, the first and second latch plates being bent from the first side to the second side, the first and second latch plates being parallel to the first extension section.

9. The radiating fin connection structure as claimed in claim 6, wherein the second extension section has a third side and a fourth side, the third and fourth latch plates being bent from the third side to the fourth side, the third and fourth latch plates being parallel to the second extension section.

10. The radiating fin connection structure as claimed in claim 6, wherein the cross section of the first, second, third and fourth latch plates is U-shaped, C-shaped, reverse U-shaped or L-shaped.

* * * * *